(12) United States Patent
Mieczkowski (10) Patent No.: US 9,343,383 B2
(45) Date of Patent: May 17, 2016

(54) HIGH VOLTAGE SEMICONDUCTOR DEVICES INCLUDING ELECTRIC ARC SUPPRESSION MATERIAL AND METHODS OF FORMING THE SAME

(75) Inventor: Van Mieczkowski, Apex, NC (US)

(73) Assignee: Cree, Inc., Durham, NC (US)

( * ) Notice: Subject to any disclaimer, the term of this patent is extended or adjusted under 35 U.S.C. 154(b) by 429 days.

(21) Appl. No.: 13/410,788

(22) Filed: Mar. 2, 2012

(65) Prior Publication Data

US 2013/0228796 A1  Sep. 5, 2013

(51) Int. Cl.
| | |
|---|---|
| *H01L 23/047* | (2006.01) |
| *H01L 23/20* | (2006.01) |
| *H01L 23/22* | (2006.01) |
| *H01L 23/60* | (2006.01) |
| *H01L 23/00* | (2006.01) |

(52) U.S. Cl.
CPC ............. *H01L 23/047* (2013.01); *H01L 23/20* (2013.01); *H01L 23/22* (2013.01); *H01L 23/60* (2013.01); *H01L 24/32* (2013.01); *H01L 24/48* (2013.01); *H01L 24/49* (2013.01); *H01L 24/73* (2013.01); *H01L 2224/32225* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01); *H01L 2924/00014* (2013.01); *H01L 2924/1033* (2013.01); *H01L 2924/10253* (2013.01); *H01L 2924/10272* (2013.01); *H01L 2924/10329* (2013.01); *H01L 2924/10338* (2013.01); *H01L 2924/12032* (2013.01); *H01L 2924/1305* (2013.01); *H01L 2924/13051* (2013.01); *H01L 2924/13063* (2013.01); *H01L 2924/13064* (2013.01); *H01L 2924/13091* (2013.01); *H01L 2924/157* (2013.01); *H01L 2924/1579* (2013.01); *H01L 2924/15153* (2013.01); *H01L 2924/15787* (2013.01); *H01L 2924/16195* (2013.01)

(58) Field of Classification Search
USPC ............................................. 257/682, 683, 77
See application file for complete search history.

(56) References Cited

U.S. PATENT DOCUMENTS

| | | | | |
|---|---|---|---|---|
| 3,674,696 | A  * | 7/1972 | Griffiths | 336/94 |
| 5,393,999 | A  * | 2/1995 | Malhi | 257/289 |
| 5,405,808 | A  * | 4/1995 | Rostoker et al. | 29/841 |
| 5,446,436 | A  * | 8/1995 | Williams | 337/273 |
| 5,506,421 | A  * | 4/1996 | Palmour | 257/77 |
| 5,780,928 | A  * | 7/1998 | Rostoker et al. | 257/713 |
| 7,435,993 | B2 * | 10/2008 | Autry et al. | 257/77 |
| 7,642,644 | B2 * | 1/2010 | Wilkins et al. | 257/721 |
| 7,936,056 | B2 * | 5/2011 | Hatakeyama | 257/682 |
| 8,168,458 | B2 * | 5/2012 | Do et al. | 438/33 |

(Continued)

OTHER PUBLICATIONS

R.J. Callanan et al, "Recent Progress in SiC DMOSFETs and JBS Diodes at Cree", IEEE Industrial Electronics 34th Annual Conference—IECON 2008, pp. 2885-2890, Nov. 10-13, 2008.*

(Continued)

*Primary Examiner* — Jarrett Stark
*Assistant Examiner* — Charles N Ausar-El
(74) *Attorney, Agent, or Firm* — Myers Bigel & Sibley, P.A.

(57) ABSTRACT

A high voltage semiconductor device can include a high voltage semiconductor device package that includes a wall defining a recess within the high voltage semiconductor device package. A high voltage semiconductor chip can be in the recess and a high voltage electric arc suppression material can be in the recess.

36 Claims, 7 Drawing Sheets

(56) References Cited

U.S. PATENT DOCUMENTS

| | | | |
|---|---|---|---|
| 8,193,848 B2* | 6/2012 | Zhang et al. | 327/318 |
| 8,415,671 B2* | 4/2013 | Zhang | 257/66 |
| 8,587,107 B2* | 11/2013 | Autry | 257/680 |
| 2005/0062140 A1* | 3/2005 | Leung | H01L 21/565 257/678 |
| 2008/0164588 A1* | 7/2008 | Lee et al. | 257/668 |
| 2009/0096041 A1* | 4/2009 | Sakakibara et al. | 257/419 |
| 2010/0301929 A1* | 12/2010 | Zhang et al. | 327/566 |
| 2011/0101375 A1* | 5/2011 | Zhang | 257/77 |
| 2011/0193098 A1* | 8/2011 | Autry | 257/77 |
| 2011/0254010 A1* | 10/2011 | Zhang | 257/66 |
| 2013/0120940 A1* | 5/2013 | Landau et al. | 361/720 |
| 2014/0217434 A1* | 8/2014 | Hussell | H01L 25/0753 257/89 |

OTHER PUBLICATIONS

Callanan B., "Application Considerations for Silicon Carbide MOSFET", CREE (www.cree.com) pp. 1-6, Jan. 2011.*

Applicant's Admitted Prior Art C4D02120E—Silicon Carbide Schottky Diode Z-Rec Rectifier Datasheet CREE.*

John W. Palmour, "Future High Voltage Silicon Carbide Power Devices—Workshop on Future Large CO2 Compression Systems", Mar. 31, 2009; Cree Inc. (www.cree.com).*

Harari, Eli; *Dielectric Breakdown in Electrically Stressed Thin Films of Thermal; $SiO_2$*; 1978 American Institute of Physics; J. Appl. Phys. 49(4); Apr. 1978, pp. 2478-2489.

D. Koch; Cashier Technique No. 188; $SF_6$ Properties, and use in MV and HV Switchgear, Schneider Electric; http://www.studiecd.dk/cahiers_techniques/SF6_properties.pdf Mar. 2, 2012.

\* cited by examiner

HIGH VOLTAGE SEMICONDUCTOR DEVICES INCLUDING ELECTRIC ARC SUPPRESSION MATERIAL AND METHODS OF FORMING THE SAME

FIELD OF THE INVENTION

The invention relates to the field of semiconductors, and more particularly to high voltage semiconductors.

BACKGROUND

It is known to utilize plastic materials, such as Thermoset, to provide the packaging for relatively low voltage, high reliability semiconductor devices such as Silicon Carbide devices, and the like. Materials such as Thermoset, however, may not be practical for all applications.

SUMMARY

In some embodiments according to the invention, a high voltage semiconductor device can include a high voltage semiconductor device package that includes a wall defining a recess within the high voltage semiconductor device package. A high voltage semiconductor chip can be in the recess and a high voltage electric arc suppression material can be in the recess.

In some embodiments according to the invention the high voltage electric arc suppression material can be a group VIIA constituent element. In some embodiments according to the invention, the high voltage electric arc suppression material comprises $SF_6$. In some embodiments according to the invention, the high voltage semiconductor device can be a Silicon Carbide (SiC) MOSFET. In some embodiments according to the invention, the SiC MOSFET can be a 20 amp SiC MOSFET wherein the high voltage semiconductor chip measures about 4 mm on a side thereof. In some embodiments according to the invention, the SiC MOSFET can be a 40 amp SiC MOSFET wherein the high voltage semiconductor chip measures about 8 mm on a side thereof. In some embodiments according to the invention, the SiC MOSFET can be a 100 amp SiC MOSFET wherein the high voltage semiconductor chip measures about 20 mm on a side thereof.

In some embodiments according to the invention, the high voltage semiconductor device package can be metal, metal coated plastic, high temperature plastic, and/or ceramic. In some embodiments according to the invention, the high voltage semiconductor device can be a Si-Lateral-diffused MOS (LDMOS) transistor, a Bipolar junction transistor, a GaAs MESFET, a GaAs or GaAs/InGaP heterojunction bipolar transistor (HBTs), a SiC MESFET or a GaN HEMT.

In some embodiments according to the invention, the high voltage semiconductor device can also include a wire lead penetrating the wall that is configured for electrically coupling a voltage of at least about 600 Volts to the chip. A submount can have the chip mounted thereon, wherein the high voltage electric arc suppression material can be a liquid or gas material having a dielectric breakdown voltage sufficient to prevent an electric arc from the wire lead to the submount.

In some embodiments according to the invention, a high voltage Silicon Carbide (SiC) semiconductor device according can include a metal semiconductor device package including a wall that defines a recess within the metal semiconductor device package. A high voltage SiC semiconductor chip, including a bonding surface thereon, the chip can be coupled to a submount surface in the recess. A wire lead can be electrically coupled to the bonding surface on the chip and $SF_6$ can be in the recess located between the wire lead at the bonding surface and the submount surface.

In some embodiments according to the invention, a distance between the wire lead at the bonding surface and the submount surface can be about 5 mm or less. In some embodiments according to the invention, the chip can be a SiC MOSFET measuring about 4 mm on a side thereof. In some embodiments according to the invention, the chip can be configured for coupling to a voltage of at least about 600 Volts provided via the wire lead penetrating the wall.

In some embodiments according to the invention, a high voltage semiconductor device can include a high voltage semiconductor device package that includes a wall that defines a recess within the high voltage semiconductor device package. A high voltage semiconductor chip can be in the recess and a high voltage electric arc suppression material can be in the recess which can be a liquid or gas material having a dielectric breakdown voltage sufficient to prevent an electric arc from the wire lead to the submount.

In some embodiments according to the invention, the high voltage electric arc suppression material can be $SOF_2$, $SO_2F_2$, $SF_6$, and/or $S_2F_{10}$.

In some embodiments according to the invention, a method of packaging a high voltage semiconductor device can be provided by providing a high voltage semiconductor device package, including a wall defining a recess within the high voltage semiconductor device package, to an atmosphere including a high voltage electric arc suppression material. A high voltage semiconductor chip can be mounted in the recess while exposed to the atmosphere and the high voltage semiconductor device package can be sealed to enclose the high voltage electric arc suppression material with the high voltage semiconductor chip in the recess.

In some embodiments according to the invention, the high voltage electric arc suppression material can be a group VIIA constituent element. In some embodiments according to the invention, the group VIIA constituent element can be fluorine.

DESCRIPTION OF EMBODIMENTS ACCORDING TO THE INVENTION

Embodiments of the present inventive subject matter now will be described more fully hereinafter with reference to the accompanying drawings, in which embodiments of the present inventive subject matter are shown. This present inventive subject matter may, however, be embodied in many different forms and should not be construed as limited to the embodiments set forth herein. Rather, these embodiments are provided so that this disclosure will be thorough and complete, and will fully convey the scope of the present inventive subject matter to those skilled in the art. Like numbers refer to like elements throughout.

As appreciated by the present inventor, as the size of high voltage semiconductor devices is reduced and the magnitude of the voltage signals handled by such devices increases, the likelihood of electric arcing inside the semiconductor package may increase. As further appreciated by the present inventor, the dielectric breakdown voltage of materials typically used to enclose such devices (such as Thermoset) can be exceeded by the combination of the magnitude of voltage signals handled by the device and the reduced spacing between conductors that carry the voltage signals inside the device and another surface that provides another potential (such as the wall of the semiconductor device). Therefore, in some embodiments according to the invention, the inclusion of a high voltage electric arc suppression material in a recess inside the package (for example, adjacent to a high voltage semiconductor chip) can reduce the likelihood of an electric arc inside the package.

In some embodiments according to the invention, the high voltage semiconductor chip is located in a recess within the high voltage semiconductor device package and the high voltage electric arc suppression material is located directly adjacent to the high voltage chip. In some embodiments according to the invention, the high voltage electric arc suppression material is located in the recess only in portions thereof where the high voltage signal provided to the chip is applied. In other embodiments according to the invention, the high voltage electric arc suppression material entirely fills the recess.

It will be understood that the term "high voltage" can include any voltage that is configured for coupling to what is commonly referred to as a high voltage semiconductor device. For example, in some embodiments according to the invention, the high voltage includes a voltage that is at least 600 volts. In some embodiments according to the invention, the term "high voltage" includes a voltage that is at least 1200 volts. In other embodiments according to the invention, the term "high voltage" includes voltages that are at least 1700 volts. In still other embodiments according to the invention, the term "high voltage" includes voltages that are at least 3400 volts.

It will be further understood that the term "high voltage" can represent a product of a voltage at a portion of the device (for example, a wire lead bonded to the chip) and a distance that separates that portion from another portion of the high voltage semiconductor chip at a lower potential relative to the high voltage portion, so that arcing between the two is likely to occur unless otherwise addressed. In other words, in some embodiments according to the invention, high voltage can be provided by a relative high voltage spaced apart from the wall of the package by a relatively large distance. "High voltage", however, can also be defined as a relatively lower high voltage that is spaced relatively close to the wall of the package.

Figure 1:
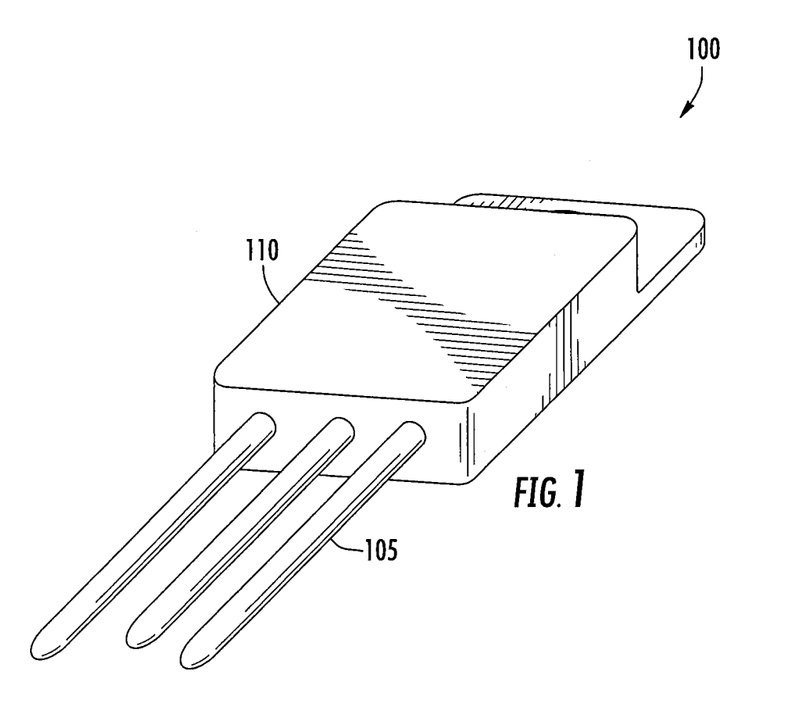
FIG. 1 is a perspective view of a 3-terminal high voltage semiconductor device in some embodiments according to the invention.

FIG. 1 is a perspective view of a 3-terminal high voltage semiconductor device 100 in some embodiments according to the invention. According to FIG. 1, the 3-terminal high voltage semiconductor device 100 includes a high voltage semiconductor device package 110 and leads 105 that are configured to couple a high voltage chip within the 3-terminal high voltage semiconductor device 100 to external circuitry. It will be understood that the high voltage semiconductor device package 110 can be a metal (such as aluminum), a ceramic (i.e. alumina), a high temperature plastic (such as Polyvinylidene fluoride (PVDF), Polytetrafluoroethylene (PTFE), Ethylene chlorotrifluoroethylene (ECTFE), Fluorinated Ethylene Propylent (FEP), Polytetrafluoroethylene (PCTFE), Perfluoroalkoxy (PFA), Polyphenylene sulfide (PPS), Polyether ether ketone (PEEK)), or a metal coated plastic.

It will be further understood that the high voltage semiconductor device package 110 can be any material that is sufficient to withstand the temperatures generated by the internal components of the 3-terminal high voltage semiconductor device 100, as well as the ambient environment in which the device 100 operates. It will be further understood that the high voltage semiconductor device package 110 can include a cover (or lid) which covers a recess in the package 110, placed thereon when the chip is packaged in the device 100. It will be understood that the package can be configured to withstand temperatures that exceed 175 degrees centigrade.

It will be understood that the 3-terminal high voltage semiconductor device 100 can be any semiconductor device capable of switching high voltage signals from one of the terminals to another under the control of the third terminal of the device. In some embodiments according to the invention, the 3-terminal high voltage semiconductor device 100 can be a SiC MOSFET, Si-Lateral-diffused MOS (LDMOS) transistor, a Bipolar junction transistor, a GaAs MESFET, a GaAs or GaAs/InGaP heterojunction bipolar transistor (HBTs), a SiC MESFET or a GaN HEMT. It will be understood that, in some embodiments according to the invention, the high voltage signals processed by the device 100 are in a frequency range that is below the microwave frequency range, such as less than about 300 MHz.

Figure 2A:
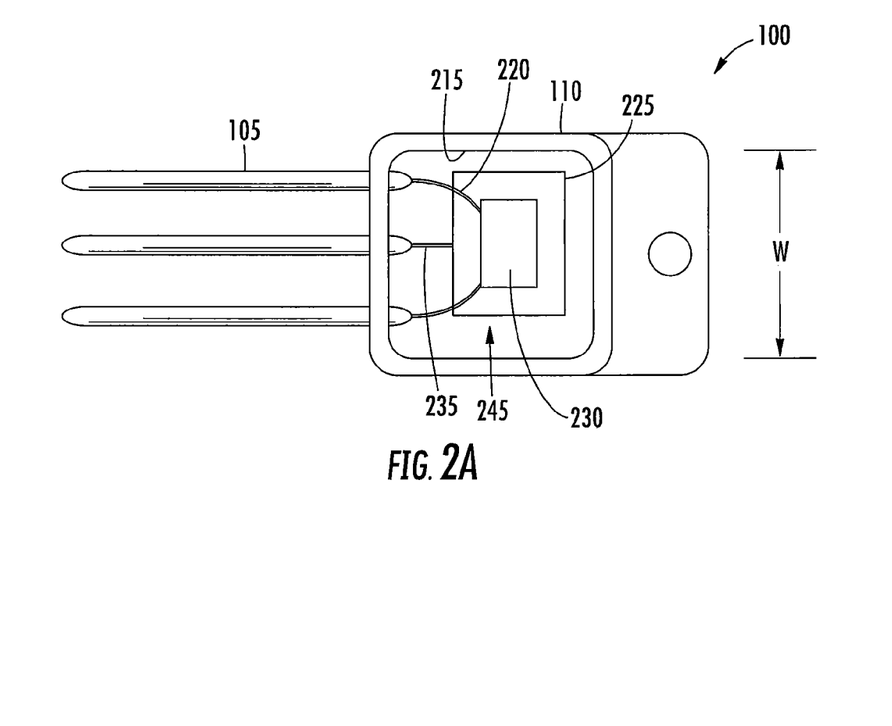
FIGS. 2A and 2B are plan and cross-sectional views, respectively, of the 3-terminal high voltage semiconductor device shown in FIG. 1 in some embodiments according to the invention.
Figure 2B:
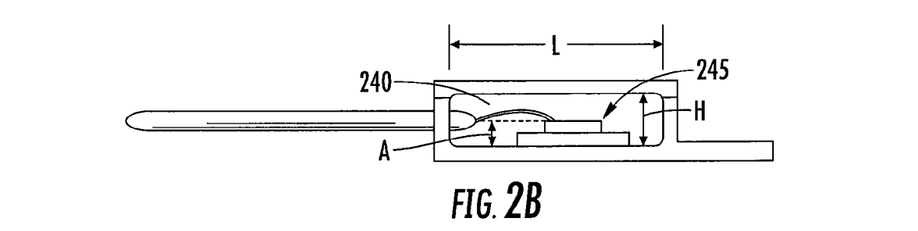

FIGS. 2A and 2B are a plan view and a cross-sectional view, respectively, of the 3-terminal high voltage semiconductor device 100 shown in FIG. 1 in some embodiments according to the invention. According to FIG. 2A, the 3-terminal high voltage semiconductor device 100 includes a wall 215 that defines a recess 240 in which a high voltage semiconductor chip 230 is mounted on a submount 225. The submount 225 is mounted on the interior surface of the recess 240. It will be understood that in some embodiments according to the invention, the submount can be absent. The leads 105 penetrate through the wall 215, and respective wires 220 are electrically coupled to the leads 105 to carry the high voltage signals between the leads 105 and the high voltage semiconductor chip 230. A high voltage electric arc suppression material 245 is located within the recess 240 directly adjacent to the high voltage semiconductor chip 230 and the wires 220 that electrically coupled the leads 105 to the chip 230.

As further illustrated in FIGS. 2A and 2B, the size of the recess 240 can be defined by the internal dimensions of the high voltage semiconductor device package 110. In particular, the volume of the recess 240 can be defined by the length L, multiplied by the height H, multiplied by the width W. In some embodiments according to the invention, the length L of the recess 240 can be about 15 mm or less and the width W of the recess 340 can be about 10 mm or less. Still further, in some embodiments according to the invention, the height H can be about 5 mm or less. Therefore, the volume of the recess 340 can be about 750 mL or less.

It will be understood that the high voltage electric arc suppression material can include a constituent element included in group VIIA of the periodic chart of elements. For example, a constituent element of the high voltage electric arc suppression material can be a halogen such as Fluorine, Chlorine, Bromine, Iodine, Astatine, or Ununseptium. In some embodiments according to the invention, the constituent element is Fluorine and the high voltage electric arc suppression material is $SF_6$. It will be understood that the constituent element of the high voltage electric arc suppression material being included in group VIIA elements of the periodic chart can allow the suppression material to capture free electrons to form heavy ions that have low mobility, which may reduce the tendency for electron avalanches to develop, thereby reducing the likelihood of electric arcs despite the presence of a high voltage gradient (e.g., a relatively high voltage placed across two relatively closely spaced points). It will be further understood that the high voltage electric arc suppression material can be present in the recess 240 in either a liquid or gaseous state or a combination of both states.

It will be further understood that the high voltage semiconductor chip 230 can be any size chip utilized for high voltage applications. For example, in some embodiments according to the invention, the high voltage semiconductor chip 230 is a 20 amp SiC MOSFET chip that measures about 4 mm on each side. In some embodiments according to the invention, the high voltage semiconductor chip 230 is a 40 amp SiC MOSFET chip that measures about 8 mm on each side. In still other embodiments according to the invention, the high voltage semiconductor chip 230 is a 100 amp SiC MOSFET chip that measures about 20 mm on each side. It will be understood that in each of these embodiments, the length L, width W, and height H of the interior dimensions of the recess 240 can be sized appropriately to accommodate each of these different sizes of SiC MOSFET chips in some embodiments according to the invention. It will be further understood that the interior dimensions defining the recess 215 can be changed to allow a greater volume of the high voltage electric arc suppression material 245 to be enclosed within the recess 240. For example, in some embodiments according to the invention, the recess 240 defines an interior volume of about 750 mL or less.

It will be further understood that the high voltage semiconductor chip 230 can be configured to operate using voltage signals provided via the leads 105 that have a magnitude that is at least 600 volts in some embodiments according to the invention. In other embodiments according to the invention, the high voltage semiconductor chip 230 is configured to operate with a voltage signal provided via the leads 105 having a magnitude of at least about 1200 volts. In still other embodiments according to the invention, the high voltage semiconductor chip 230 is configured to operate responsive to high voltage signals having a magnitude of at least about 1700 volts. In yet further embodiments according to the invention, the high voltage semiconductor chip 230 is configured to operate responsive to high voltage signals having a magnitude of at least about 3400 volts. It will be further understood that voltages less than 600 volts, may also be utilized in some embodiments according to the invention.

As further shown in FIG. 2B, the wires 220 can be electrically coupled to a portion of the high voltage semiconductor chip 230 and to the leads 105 such that the high voltage signals provided thereon have a minimum spacing of "A" from a closest portion of the high voltage semiconductor device within the recess 240, where an electric arc may occur. Therefore, it will be understood that the high voltage electric arc suppression material 245 is provided at least adjacent to the portion of the lead 105, the wire 220 and/or the high voltage semiconductor chip 230 that is the closest to another portion within the package 110 that defines a potential difference relative to the high voltage signal sufficient for an electric arc. For example, in some embodiments according to the invention, the spacing A is about 5 mm or less.

As appreciated by the present inventor, a conventional plastic, for example Thermoset, used as the packaging material in conventional SiC high voltage semiconductor devices may have a dielectric breakdown voltage that is low enough where an arc can develop through the Thermoset plastic itself, which in turn, can cause the Thermoset to change phase and allow an electric arc through the plastic itself, leading to a device failure. Therefore, in some embodiments according to the invention, the high voltage electric arc suppression material 245 enclosed in the recess 240 can reduce the likelihood of an electric arc when a high voltage signal is provided to the chip 230.

Figure 3:
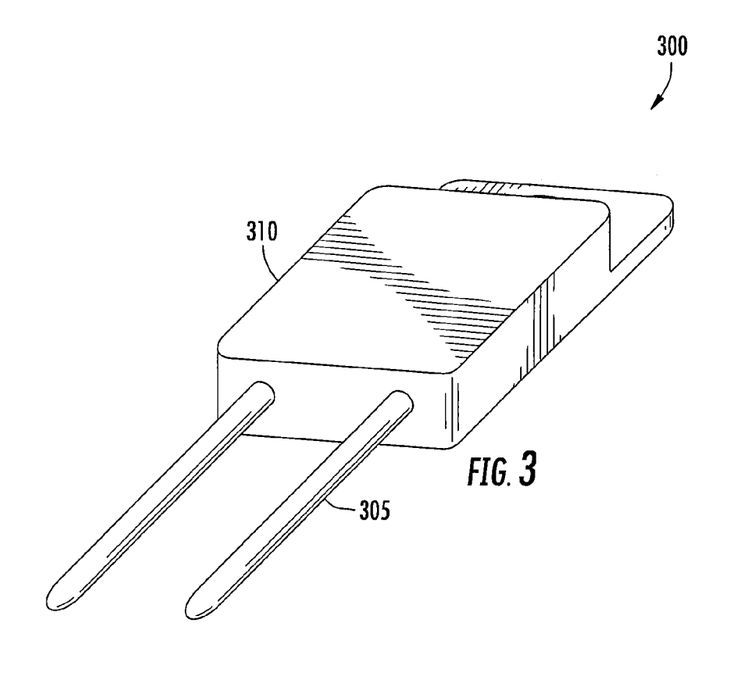
FIG. 3 is a perspective view illustrating a 2-terminal high voltage semiconductor device in some embodiments according to the invention.

FIG. 3 is a perspective view of a two terminal high voltage semiconductor device 300 in some embodiments according to the invention. According to FIG. 3, the two terminal high voltage semiconductor device 300 includes a high voltage semiconductor device package 310 and a pair of leads 305 that penetrate the wall of the package 310. It will be understood that in some embodiments according to the invention, the high voltage semiconductor device package 310 can be a metal, a ceramic, a metal coated plastic, a high temperature plastic, etc. It will be further understood that the high voltage semiconductor device package 110 can include a cover (or lid) which covers a recess in the package 310, placed thereon when the chip is packaged in the device 100. In some embodiments according to the invention, the cover hermetically seals the high voltage semiconductor device package 110. It will be understood that the package can be configured to withstand temperatures that exceed 175 degrees centigrade.

In some embodiments according to the invention, the two terminal high voltage semiconductor device can be a silicon carbide Schottky diode, such as a C4D02120E silicon carbide Schottky diode available from Cree, Inc. of Durham, N.C., modified to provide the aspects described herein (such as the recess).

Figure 4A:
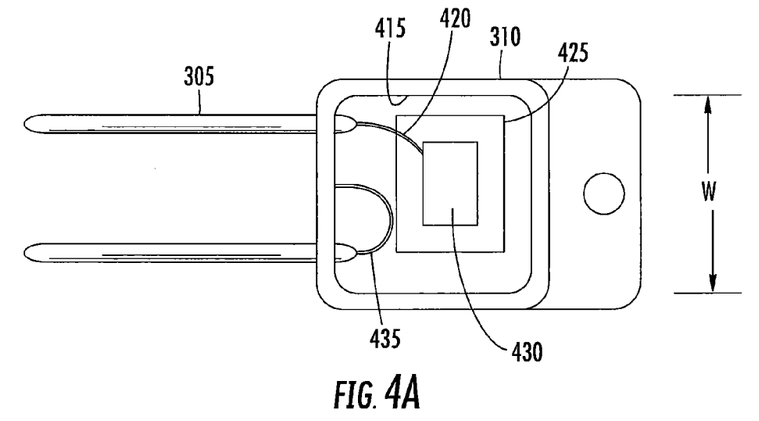
FIGS. 4A and 4B are plan and cross-sectional views, respectively, of the 2-terminal high voltage semiconductor device shown in FIG. 3 in some embodiments according to the invention.
Figure 4B:
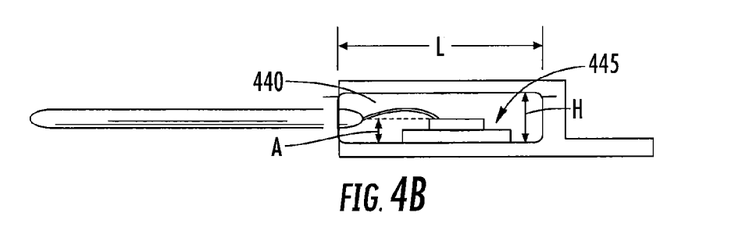

FIGS. 4A and 4B are a plan view and a cross sectional view, respectively, illustrating the two terminal high voltage semiconductor device 300 shown in FIG. 3. According to FIGS. 4A and 4B the two leads 305 penetrate a wall 415 that defines a recess 440 within the two terminal high voltage semiconductor device package 310. The leads 305 are configured to be electrically coupled to high voltage signals that are electrically coupled to a high voltage semiconductor chip 430 within the recess 440. The high voltage semiconductor chip 430 can be mounted on a submount 425 also within the recess 440 which is in contact with a base surface of the recess 440.

The volume of the recess 440 can be defined by the length (L), height (H) and width (W) of the recess 440. In some embodiments according to the invention, the length L of the recess 440 can be about 15 mm or less and the width W of the recess 440 can be about 10 mm or less. Still further, in some embodiments according to the invention, the height H can be about 5 mm or less. Therefore, the volume of the recess 440 can be about 750 mL or less.

The volume of the recess 440 can allow for the inclusion of the high voltage electric arc suppression material 445 therein to reduce the probability of an electric arc from the leads 305 or wires 420 to a portion of the high voltage semiconductor device package 310 providing a lower potential. For example, as shown in FIG. 4B, the wire 420 is separated from the base surface of the high voltage semiconductor device package 310 by a distance "A." Therefore, in some embodiments according to the invention, the high voltage electric arc suppression material 445 is selected to provide sufficient electric arc suppression for high voltages that would otherwise arc across the distance A to the base of the high voltage semiconductor device package 310.

It will be further understood that the high voltage semiconductor chip 430 can be configured to operate using voltage signals provided via the leads 305 that have a magnitude that is at least 600 volts in some embodiments according to the invention. In other embodiments according to the invention, the high voltage semiconductor chip 430 is configured to operate with a voltage signal provided via the leads 305 having a magnitude of at least about 1200 volts. In still other embodiments according to the invention, the high voltage semiconductor chip 430 is configured to operate responsive to high voltage signals having a magnitude of at least about 1700 volts. In yet further embodiments according to the invention, the high voltage semiconductor chip 430 is configured to operate responsive to high voltage signals having a magnitude of at least about 3400 volts. It will be further understood that voltages less than 600 volts, may also be utilized in some embodiments according to the invention.

Figure 5:
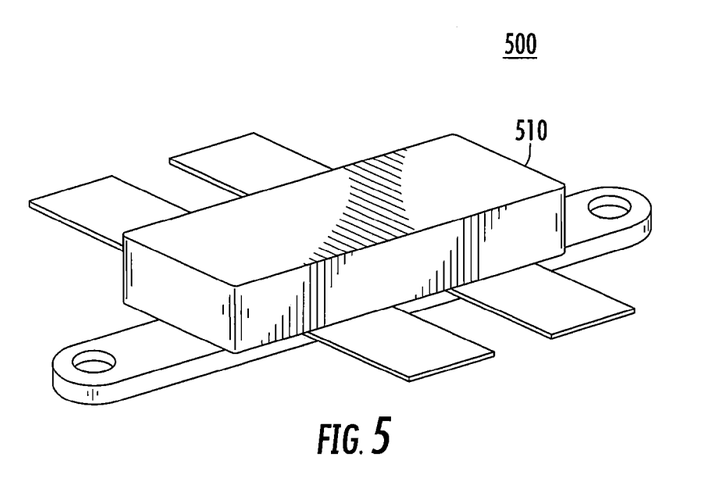
FIG. 5 is a perspective view of a high voltage semiconductor device in some embodiments according to the invention.

FIG. 5 is a perspective view of a RF power gallium nitride high electron mobility transistor 500 in some embodiments according to the invention. According to FIG. 5, the RF power GaN HEMT device 500 can be a device such as a CGH40180PP GaN HEMT device available from Cree, Inc. of Durham, N.C. The GaN HEMT device 500 can operate at input voltages as low as 28 volts, which may be closely spaced apart from interior surfaces of the device 500, which may increase the likelihood of electric arcing without the inclusion of the high voltage electric arc suppression material. Therefore, in some embodiments according to the invention, a recess within the device 500 allows for the inclusion of a high voltage arc suppression material directly adjacent to the high voltage device and associated conductive surfaces, as described herein, to reduce the likelihood of electric arcing.

Figure 6:
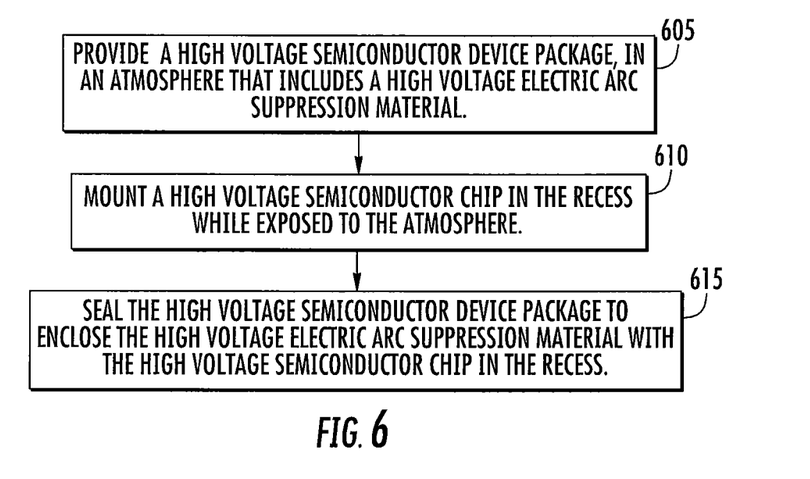
FIG. 6 is a flowchart illustrating methods of forming high voltage semiconductor devices in some embodiments according to the invention.

FIG. 6 is a flowchart that illustrate methods of forming high voltage semiconductor devices in some embodiments according to the invention. According to block 605, a high voltage semiconductor device package is provided in an atmosphere that includes a high voltage electric arc suppression material including a constituent element selected from Group VIIA of the periodic chart of elements. For example, in some embodiments according to the invention, the constituent element is Fluorine and the high voltage electric arc suppression material is $SF_6$. It will be understood in some embodiments that the high voltage electric arc suppression material can be provided in either a liquid and/or gaseous state in the atmosphere in which the high voltage semiconductor device package is provided. For example, in some embodiments according to the invention, the high voltage semiconductor device package is placed within a chamber into which $SF_6$ gas is introduced.

A high voltage semiconductor chip is mounted within a recess in the high voltage semiconductor package while the semiconductor device package and the chip are exposed to the atmosphere including the high voltage electric arc suppression material. It will be understood that in some embodiments according to the invention, the high voltage semiconductor device chip is mounted on a submount which in turn is soldered to a base surface of the recess of the high voltage semiconductor device package (block 610).

The high voltage semiconductor device package with the high voltage semiconductor chip mounted therein is then sealed while exposed to the atmosphere including the high voltage electric arc suppression material (block 615). Sealing the high voltage semiconductor device package while in the atmosphere can enclose at least a portion of the high voltage electric arc suppression material within the recess adjacent to the high voltage semiconductor chip.

Figure 7:
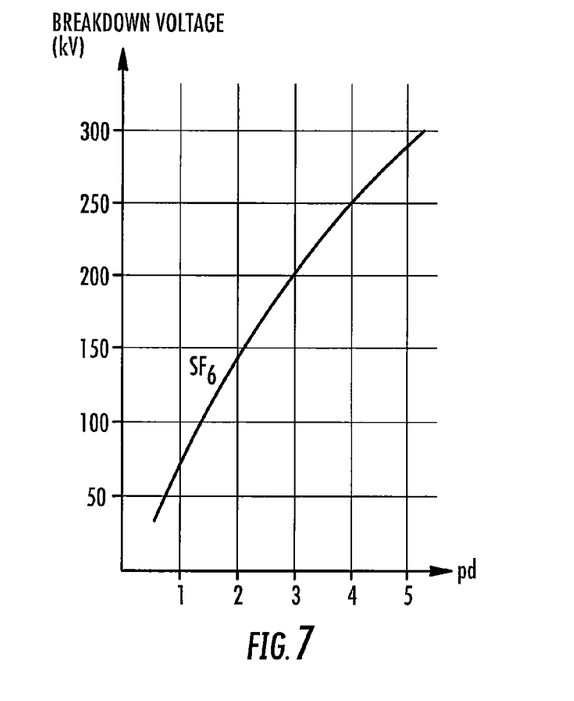
FIG. 7 is a graph that illustrates the dielectric breakdown voltage of $SF_6$ as a function of the product of pressure and distance in a uniform field.

In some embodiments according to the invention, the atmosphere in which the high voltage semiconductor device package and chip are placed is provided under pressure so that when the high voltage semiconductor device package is sealed, the high voltage electric arc suppression material enclosed within the recess is maintained at pressure to improve the performance of the high voltage arc suppression material within the recess. For example, as shown in FIG. 7, as the pressure increases, the dielectric breakdown voltage of the high voltage electric arc suppression material (shown here as $SF_6$) increases. Therefore, in some embodiments according to the invention, when the high voltage electric arc suppression material is provided at higher pressure within the sealed recess, the dielectric breakdown voltage of the high voltage electric arc suppression material may be increased so that the likelihood of electric arcing may be further reduced for situations when the high voltage signal is relatively close to a lower potential surface as well other situations when the high voltage signal is relatively high, yet farther spaced from the lower potential surface. Still further, as the temperature of the environment in which the high voltage semiconductor device increases (such as if the high voltage semiconductor device package is exposed to drilling operations) the temperature of the high voltage electric arc suppression material within the recess may increase thereby also increasing the pressure of the material inside the package, which results in yet higher breakdown voltage for the high voltage electric arc suppression material, such as $SF_6$. Therefore, as is appreciated by the present inventor, as the temperature of the high voltage electric arc suppression increases, higher dielectric breakdown voltages can be provided by the high voltage electric arc suppression material.

Figure 8:
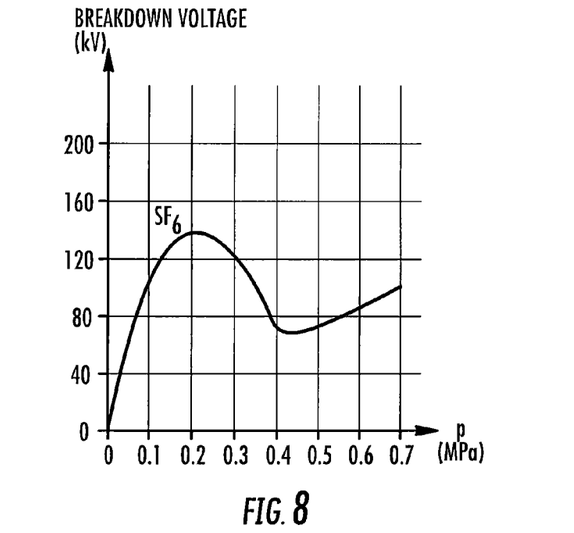
FIG. 8 is a graph that illustrates the dielectric breakdown voltage of $SF_6$ as a function of pressure in a non-uniform electric field.

As further shown in FIG. 8, when the high voltage signal provided to the high voltage semiconductor device is not uniform (for example, when the high voltage signal includes high frequency transients) the dielectric breakdown voltage of the high voltage electric arc suppression material can be relatively high over a defined range of pressure within the recess. For example, in some embodiments according to the invention, if the high voltage electric arc suppression material within the recess is provided at a pressure of between about 0.05 MPa and 0.4 MPa, the dielectric breakdown voltage may be elevated. In other words, even if the high voltage signal is spaced apart from a lower potential surface by the same distance in two different devices, if the recess in one of the devices is maintained at a pressure between about 0.05 and 0.4 MPa, the dielectric breakdown voltage of the high voltage electric arc suppression material in the higher pressurized package may be higher than that of the other device even though the spacing between the high voltage signal and the lower potential surface in each of those devices is the same. Accordingly, pressurizing the high voltage arc suppression material within the recess of the package may provide still further improvement in the high voltage electric arc suppression material.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive subject matter. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments of the inventive subject matter are described herein with reference to plan and perspective illustrations that are schematic illustrations of idealized embodiments of the inventive subject matter. As such, variations from the shapes of the illustrations as a result, for example, of manufacturing techniques and/or tolerances; are to be expected. Thus, the inventive subject matter should not be construed as limited to the particular shapes of objects illustrated herein, but should include deviations in shapes that result, for example, from manufacturing. Thus, the objects illustrated in the figures are schematic in nature and their shapes are not intended to illustrate the actual shape of a region of a device and are not intended to limit the scope of the inventive subject matter.

The terminology used herein is for the purpose of describing particular embodiments only and is not intended to be limiting of the present inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

It will be understood that, as used herein, the semiconductor devices can include one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers.

In the drawings and specification, there have been disclosed typical preferred embodiments of the inventive subject matter and, although specific terms are employed, they are used in a generic and descriptive sense only and not for purposes of limitation, the scope of the inventive subject matter being set forth in the following claims.

What is claimed:

1. A high voltage semiconductor device comprising:
a high voltage semiconductor device package including a wall defining a recess within the high voltage semiconductor device package;
a high voltage semiconductor chip in the recess; and
a high voltage electric arc suppression material comprising $SOF_2$, $SO_2F_2$, $SF_6$, and/or $S_2F_{10}$ in the recess, wherein high voltage comprises at least about 600 Volts.

2. The high voltage semiconductor device of claim 1 wherein the high voltage semiconductor device comprises a Silicon Carbide (SiC) MOSFET.

3. The high voltage semiconductor device of claim 2 wherein the SiC MOSFET comprises a 20 amp SiC MOSFET wherein the high voltage semiconductor chip measures about 4 mm on a side thereof.

4. The high voltage semiconductor device of claim 2 wherein the SiC MOSFET comprises a 40 amp SiC MOSFET wherein the high voltage semiconductor chip measures about 8 mm on a side thereof.

5. The high voltage semiconductor device of claim 2 wherein the SiC MOSFET comprises a 100 amp SiC MOSFET wherein the high voltage semiconductor chip measures about 20 mm on a side thereof.

6. The high voltage semiconductor device of claim 1 wherein the high voltage semiconductor device package comprises metal, metal coated plastic, high temperature plastic, and/or ceramic.

7. The high voltage semiconductor device of claim 1 wherein the high voltage semiconductor device comprises a Si-Lateral-diffused MOS (LDMOS) transistor, a Bipolar junction transistor, a GaAs MESFET, a GaAs or GaAs/InGaP heterojunction bipolar transistor (HBTs), a SiC MESFET or a GaN HEMT.

8. The high voltage semiconductor device of claim 1 wherein the high voltage semiconductor device comprises a SiC Schottky Diode.

9. The high voltage semiconductor device of claim 1 wherein the high voltage semiconductor chip is configured for coupling to a voltage of at least about 600 Volts provided via a lead penetrating the wall.

10. The high voltage semiconductor device of claim 1 wherein the high voltage semiconductor chip is configured for coupling to a voltage of at least about 1200 Volts provided via a lead penetrating the wall.

11. The high voltage semiconductor device of claim 1 wherein the high voltage semiconductor chip is configured for coupling to a voltage of at least about 1700 Volts provided via a lead penetrating the wall.

12. The high voltage semiconductor device of claim 1 wherein the high voltage semiconductor chip is configured for coupling to a voltage of at least about 3400 Volts provided via a lead penetrating the wall.

13. The high voltage semiconductor device of claim 1 wherein a volume defined by the recess comprises about 750 mL or less.

14. The high voltage semiconductor device of claim 1 wherein a length of the recess comprises about 15 mm or less and a width of the recess comprises about 10 mm or less.

15. The high voltage semiconductor device of claim 1 wherein the high voltage semiconductor chip comprises a two terminal device.

16. The high voltage semiconductor device of claim 15 wherein a path through the high voltage electric arc suppression material from a first terminal configured to couple to a high voltage to a second terminal configured to couple to a reference voltage for the device is about 5 mm or less.

17. The high voltage semiconductor device of claim 1 wherein the high voltage semiconductor chip comprises a three terminal device.

18. The high voltage semiconductor device of claim 17 wherein a path through the high voltage electric arc suppression material from a first terminal configured to couple to a high voltage to a second terminal configured to couple to a reference voltage for the device is about 5 mm or less.

19. The high voltage semiconductor device of claim 1 further comprising:
a wire lead penetrating the wall and configured for electrically coupling a voltage of at least about 600 Volts to the chip; and
a submount having the chip mounted thereon, wherein the high voltage electric arc suppression material comprises a liquid or gas material having a dielectric breakdown voltage sufficient to prevent an electric arc from the wire lead to the submount.

20. The high voltage semiconductor device of claim 1 wherein the high voltage electric arc suppression material is hermetically sealed in the recess.

21. A high voltage Silicon Carbide (SiC) semiconductor device comprising:
a metal semiconductor device package including a wall defining a recess within the metal semiconductor device package;
a high voltage SiC semiconductor chip, including a bonding surface thereon, the chip coupled to a submount surface in the recess, wherein high voltage comprises at least about 600 Volts;
a wire lead electrically coupled to the bonding surface on the chip; and
$SF_6$ in the recess located between the wire lead at the bonding surface and the submount surface.

22. The high voltage SiC semiconductor device of claim 21 wherein a distance between the wire lead at the bonding surface and the submount surface comprises about 5 mm or less.

23. The high voltage SiC semiconductor device of claim 21 wherein the chip comprises a SiC MOSFET measuring about 4 mm on a side thereof.

24. The high voltage SiC semiconductor device of claim 21 wherein the chip is configured for coupling to a voltage of at least about 600 Volts provided via the wire lead penetrating the wall.

25. The high voltage SiC semiconductor device of claim 21 wherein the chip is configured for coupling to a voltage of at least about 1200 Volts provided via the wire lead penetrating the wall.

26. The high voltage SiC semiconductor device of claim 21 wherein a volume defined by the recess comprises about 750 mm$^3$ or less.

27. The high voltage SiC semiconductor device of claim 21 wherein the chip is configured for coupling to a voltage of at least about 1700 Volts provided via the wire lead penetrating the wall.

28. The high voltage SiC semiconductor device of claim 21 wherein the chip is configured for coupling to a voltage of at least about 3400 Volts provided via the wire lead penetrating the wall.

29. A high voltage semiconductor device comprising:
a high voltage semiconductor device package including a wall defining a recess within the high voltage semiconductor device package;
a high voltage semiconductor chip in the recess; and
a high voltage electric arc suppression material in the recess comprising a liquid or gas material having a dielectric breakdown voltage sufficient to prevent an electric arc from the wire lead to a submount, wherein high voltage comprises at least about 600 Volts and wherein the high voltage electric arc suppression material comprises $SOF_2$, $SO_2F_2$, $SF_6$, and/or $S_2F_{10}$.

30. A method of packaging a high voltage semiconductor device comprising:
providing a high voltage semiconductor device package, including a wall defining a recess within the high voltage semiconductor device package, to an atmosphere including a high voltage electric arc suppression material;
mounting a high voltage semiconductor chip in the recess while exposed to the atmosphere; and
sealing the high voltage semiconductor device package to enclose the high voltage electric arc suppression material with the high voltage semiconductor chip in the recess, wherein high voltage comprises at least about 600 Volts and wherein the high voltage electric arc suppression material comprises $SOF_2$, $SO_2F_2$, $SF_6$, and/or $S_2F_{10}$.

31. The method of claim 30 wherein the high voltage semiconductor device comprises a SiC MOSFET a Si-LDMOS transistor, a Bipolar junction transistor, a GaAs MESFET, a GaAs or GaAs/InGaP HBT, a SiC MESFET or a GaN HEMT.

32. The method of claim 31 wherein the SiC MOSFET comprises a 20 amp SiC MOSFET wherein the high voltage semiconductor chip measures about 4 mm on a side thereof.

33. The high voltage semiconductor device of claim 30 wherein the high voltage semiconductor device package comprises metal, metal coated plastic, high temperature plastic, and/or ceramic.

34. The high voltage semiconductor device of claim 30 wherein the high voltage semiconductor device package is configured for operation at a temperature of about 175 degrees Centigrade or greater.

35. The high voltage semiconductor device of claim 1 wherein the high voltage semiconductor device is configured to operate using current of about at least 10 amps.

36. The high voltage semiconductor device of claim 1 wherein the high voltage electric arc suppression material is at a pressure in the recess in a range between about 0.05 MPa and about 0.4 MPa.

* * * * *